(12) United States Patent
Lue et al.

(10) Patent No.: US 9,087,825 B2
(45) Date of Patent: Jul. 21, 2015

(54) SEMICONDUCTOR STRUCTURE AND METHOD FOR MANUFACTURING THE SAME

(71) Applicant: MACRONIX INTERNATIONAL CO., LTD., Hsinchu (TW)

(72) Inventors: Hang-Ting Lue, Hsinchu (TW); Yi-Hsuan Hsiao, Budai Township, Chiayi County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 99 days.

(21) Appl. No.: 14/049,253

(22) Filed: Oct. 9, 2013

(65) Prior Publication Data

US 2014/0035140 A1    Feb. 6, 2014

Related U.S. Application Data

(62) Division of application No. 13/009,502, filed on Jan. 19, 2011, now Pat. No. 8,609,554.

(51) Int. Cl.
| | |
|---|---|
| *H01L 23/485* | (2006.01) |
| *H01L 27/115* | (2006.01) |
| *H01L 29/423* | (2006.01) |
| *H01L 29/792* | (2006.01) |
| *H01L 23/00* | (2006.01) |

(52) U.S. Cl.
CPC .............. *H01L 23/485* (2013.01); *H01L 24/64* (2013.01); *H01L 27/11578* (2013.01); *H01L 29/4234* (2013.01); *H01L 29/792* (2013.01)

(58) Field of Classification Search
CPC ... H01L 27/105; H01L 27/115; H01L 29/423; H01L 21/42324; H01L 21/762022
See application file for complete search history.

(56) References Cited

U.S. PATENT DOCUMENTS

| | | | |
|---|---|---|---|
| 5,208,175 A | 5/1993 | Choi et al. | |
| 5,574,305 A * | 11/1996 | Lien et al. | ...................... 257/515 |
| 6,362,048 B1 * | 3/2002 | Huang | ........................... 438/257 |

(Continued)

FOREIGN PATENT DOCUMENTS

CN             101217162 A     7/2008

OTHER PUBLICATIONS

English Abstract translation of CN101217162 (Published Jul. 9, 2008).
TW Office Action dated Aug. 14, 2013.
Lue, H.T., et al; "A Highly Scalable 8-Layer 3D Vertical-Gate (VG) TFT NAND Flash Using Junction-Free Buried 1 Channel BE-SONOS Device;" IEEE Symposium on VLSI Technology Digest of Technical Papers; 2010; pp. 131-132.

*Primary Examiner* — S V Clark
(74) *Attorney, Agent, or Firm* — McClure, Qualey & Rodack, LLP

(57) ABSTRACT

A semiconductor structure and a method for manufacturing the same are provided. The method comprises following steps. A first silicon-containing conductive material is formed on a substrate. A second silicon-containing conductive material is formed on the first silicon-containing conductive material. The first silicon-containing conductive material and the second silicon-containing conductive material have different dopant conditions. The first silicon-containing conductive material and the second silicon-containing conductive material are thermally oxidized for turning the first silicon-containing conductive material wholly into an insulating oxide structure, and the second silicon-containing conductive material into a silicon-containing conductive structure and an insulating oxide layer.

11 Claims, 3 Drawing Sheets

(56) References Cited

U.S. PATENT DOCUMENTS

| | | |
|---|---|---|
| 6,767,791 B1 * | 7/2004 | Wu et al. ................ 438/257 |
| 7,414,889 B2 | 8/2008 | Lue et al. |
| 2007/0284620 A1 | 12/2007 | Lue et al. |
| 2009/0072344 A1 * | 3/2009 | Im ................ 257/509 |
| 2010/0226195 A1 | 9/2010 | Lue |
| 2011/0065256 A1 * | 3/2011 | Foote et al. ................ 438/439 |
| 2011/0217850 A1 * | 9/2011 | Mani et al. ................ 438/785 |

* cited by examiner

SEMICONDUCTOR STRUCTURE AND METHOD FOR MANUFACTURING THE SAME

The application is a divisional application of U.S. patent application Ser. No. 13/009,502, filed on Jan. 19, 2011, now U.S. Pat. No. 8,609,554. The subject matter of this application is incorporated herein by reference.

BACKGROUND

1. Technical Field

The disclosure relates to a semiconductor structure and a method for manufacturing the same.

2. Description of the Related Art

Memory devices are used in storage elements for many products such as MP3 players, digital cameras, computer files, etc. As the application increases, the demand for the memory device focuses on small size and large memory capacity. For satisfying the requirement, a memory having a high element density is need.

Designers have developed a method for improving a memory device density, using 3D stack memory device so as to increase a memory capacity and a cost per cell. However, the scaling limitation of a memory cell size of this kind of the memory device is still bigger than 50 nm. It is not easy to breakthrough the limitation. The performance of the memory device may also be limited due to its element material.

SUMMARY

A method for manufacturing a semiconductor structure is provided. The method comprises following steps. A first silicon-containing conductive material is formed on a substrate. A second silicon-containing conductive material is formed on the first silicon-containing conductive material. The first silicon-containing conductive material and the second silicon-containing conductive material have different dopant conditions. The first silicon-containing conductive material and the second silicon-containing conductive material are thermally oxidized for turning the first silicon-containing conductive material wholly into an insulating oxide structure, and the second silicon-containing conductive material into a silicon-containing conductive structure and an insulating oxide layer on the surface of the silicon-containing conductive structure and contact with the silicon-containing conductive structure.

A semiconductor structure is provided. The semiconductor structure comprises a substrate, an insulating oxide structure, a silicon-containing conductive structure, and an insulating oxide layer. The insulating oxide structure is formed on the substrate. The silicon-containing conductive structure and the insulating oxide layer are formed on the insulating oxide structure. At least one of the insulating oxide structure and the insulating oxide layer has a bird's beak profile.

The following description is made with reference to the accompanying drawings.

DETAILED DESCRIPTION

Embodiments of the present disclosure relate to a semiconductor structure and a method for manufacturing the same. The semiconductor has a small feature size and excellent characteristic.

Figure 1:
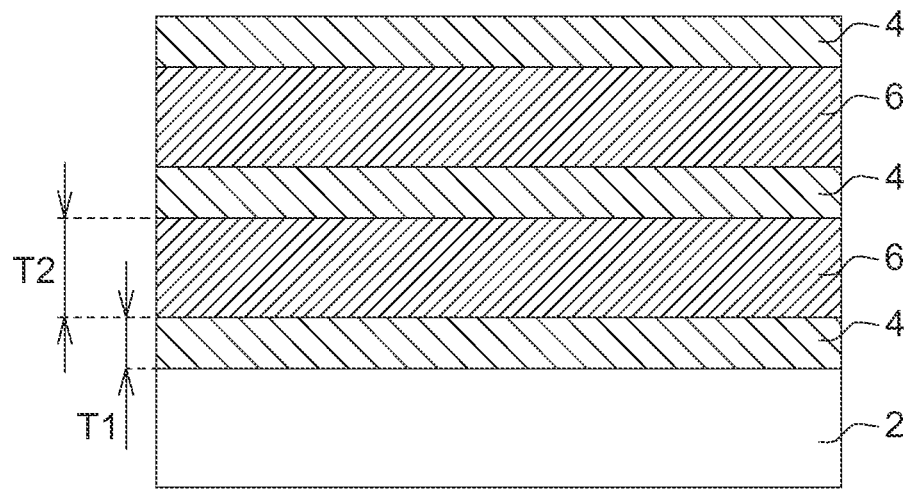
FIG. 1 to FIG. 4 illustrate a method for manufacturing a semiconductor structure in one embodiment.

FIG. 1 to FIG. 4 illustrate a method for manufacturing a semiconductor structure in one embodiment. Referring to FIG. 1, first silicon-containing conductive materials 4 and second silicon-containing conductive materials 6 are stacked on a substrate 2. The second silicon-containing conductive materials 6 are separated from each other by the first silicon-containing conductive materials 4. For example, the first silicon-containing conductive material 4 has a thickness T1, about 20 nm. The second silicon-containing conductive material 6 has a thickness T2, about 40 nm.

Referring to FIG. 1, in one embodiment, the substrate 2 is single crystal silicon, and the first silicon-containing conductive materials 4 and the second silicon-containing conductive materials 6 are single crystal silicon formed from the substrate 2 by an epitaxial growth. For example, the substrate 2 is single crystal silicon. The first silicon-containing conductive material 4 is single crystal silicon formed from the substrate 2 by an epitaxial growth. The second silicon-containing conductive material 6 is single crystal silicon formed from the first silicon-containing conductive material 4 by an epitaxial growth. The first silicon-containing conductive material 4 is single crystal silicon formed from the second silicon-containing conductive material 6 by an epitaxial growth. Therefore, the second silicon-containing conductive materials 4 and the second silicon-containing conductive material 6 can be single crystal having an excellent structure and conductivity characteristic. Thus performance of the semiconductor structure is improved.

Figure 2:
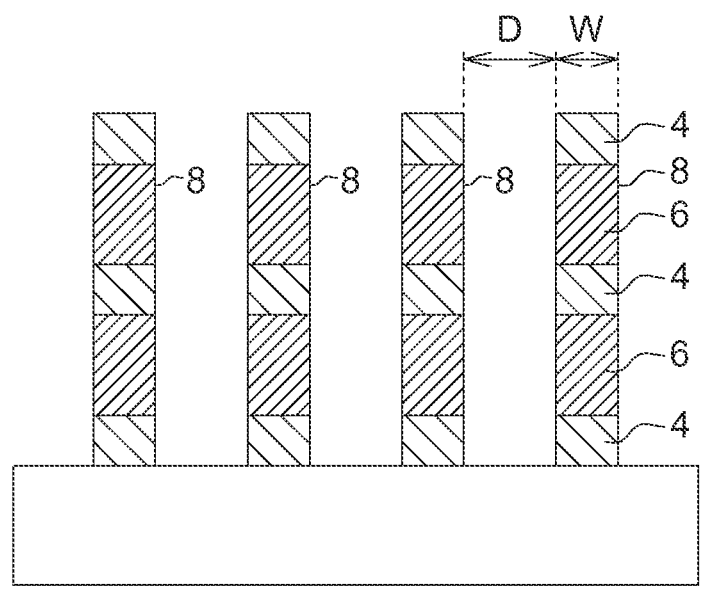

The first silicon-containing conductive materials 4 and the second silicon-containing conductive materials 6 are patterned for forming stacked structures 8 as shown in FIG. 2. Referring to FIG. 2, each of the stacked structure 8 comprises the first silicon-containing conductive materials 4 and the second silicon-containing conductive materials 6 stacked alternately. A method for the pattering comprises removing a part of the first silicon-containing conductive materials 4 and the second silicon-containing conductive materials 6 by an etching process. In one embodiment, the first silicon-containing conductive materials 4 and the second silicon-containing conductive materials 6 have similar materials such as silicon. Thus, the etching process has substantially the same etching rate for the first silicon-containing conductive materials 4 and the second silicon-containing conductive materials 6. Therefore, the etching process CaO be exactly controlled to patterning the first silicon-containing conductive materials 4 and the second silicon-containing conductive materials 6 into a fine profile or high aspect ratio. For example, the stacked structure 8 has a width W, about 20 nm. The two adjacent stacked structures 8 has a distance D, about 130 nm, therebetween.

Figure 3:
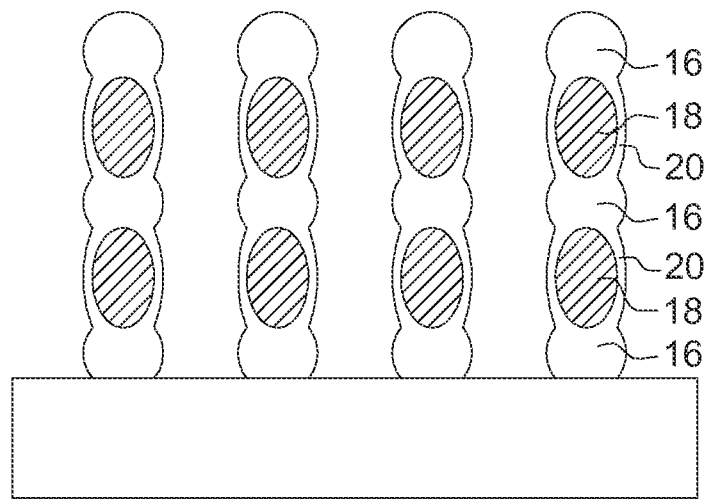

Each of the first silicon-containing conductive materials 4 and the second silicon-containing conductive materials 6 are thermally oxidized for turning the first silicon-containing conductive material 4 wholly into an insulating oxide structure 16, and the second silicon-containing conductive material 6 into a silicon-containing conductive structure 18 and an insulating oxide layer 20 on the surface of the silicon-containing conductive structure 18 and contact witch the silicon-containing conductive structure 18 as shown in FIG. 3. Referring to FIG. 3 the insulating oxide structure 16 and the insulating oxide layer 20 have a bird's beak profile. For example, the thermally oxidizing process comprises heating the first silicon-containing conductive materials 4 (FIG. 2) and the second silicon-containing conductive materials 6 placed in an oxygen condition, diffusing oxygen into the first silicon-containing conductive materials 4 and the second silicon-containing conductive materials 6 from the surfaces of which to react to produce an insulating oxide such as silicon oxide.

In embodiments, the first silicon-containing conductive material 4 (FIG. 2) and the second silicon-containing conductive material 6 have different dopant conditions. Thus, under a thermal oxidizing process of the same condition, or during the thermally oxidizing the first silicon-containing conductive materials 4 and the second silicon-containing conductive materials 6 simultaneously, the first silicon-containing conductive material 4 and the second silicon-containing conductive material 6 have different oxide diffusion rates. In embodiments, the first silicon-containing conductive material 4 and the second silicon-containing conductive material 6 have dopants of different concentrations and the same conductivity type. For example, the first silicon-containing conductive material 4 and the second silicon-containing conductive material 6 both have N type dopant, and the concentration of the N type dopant of the first silicon-containing conductive material 4 is bigger than the concentration of the N type dopant of the second silicon-containing conductive material 6. For example, there may be 2-3 orders difference between the concentrations of the N type dopants of the first silicon-containing conductive material 4 and the second silicon-containing conductive material 6. Therefore, the first silicon-containing conductive material 4 has an oxide diffusion rate higher than an oxide diffusion rate the second silicon-containing conductive material 6 has. The N-type dopant comprises a VIA-group element such as P, As etc. Otherwise, the first silicon-containing conductive material 4 and the second silicon-containing conductive material 6 both have P type dopant. In addition, the concentration of the P type dopant of the first silicon-containing conductive material 4 is different from the concentration of the P type dopant of the second silicon-containing conductive material 6. The P-type dopant comprises a IIIA-group element such as B etc. The oxidation situation of the first silicon-containing conductive material 4 and the second silicon-containing conductive material 6 can he controlled by adjusting parameters of the oxidizing process such as a heating temperature, a heating time, etc.

Figure 4:
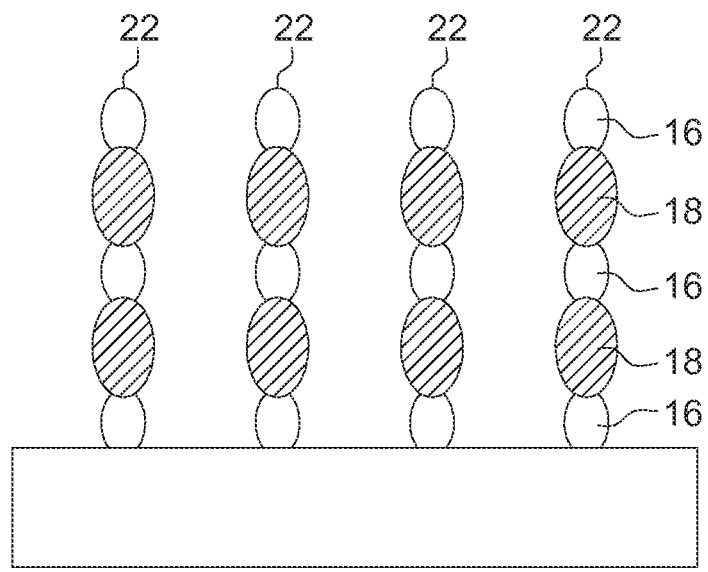

The insulating oxide layers 20 are removed for forming stacked structures 22 as shown in FIG. 4. In embodiments, the insulating oxide layers 20 are removed by using an etching process having an etching selectivity to an insulating oxide (such as silicon oxide) and a silicon-containing conductive material (such as single crystal silicon). Thus, during the removing the insulating oxide layer 20, a part of the insulating oxide structure 16 is also removed simultaneously. The insulating oxide structure 16 becomes small. Meanwhile, the silicon-containing conductive structure 18 is not damaged substantially. For example, the etching process comprises a dry etching method or a wet etching method.

Figure 5:
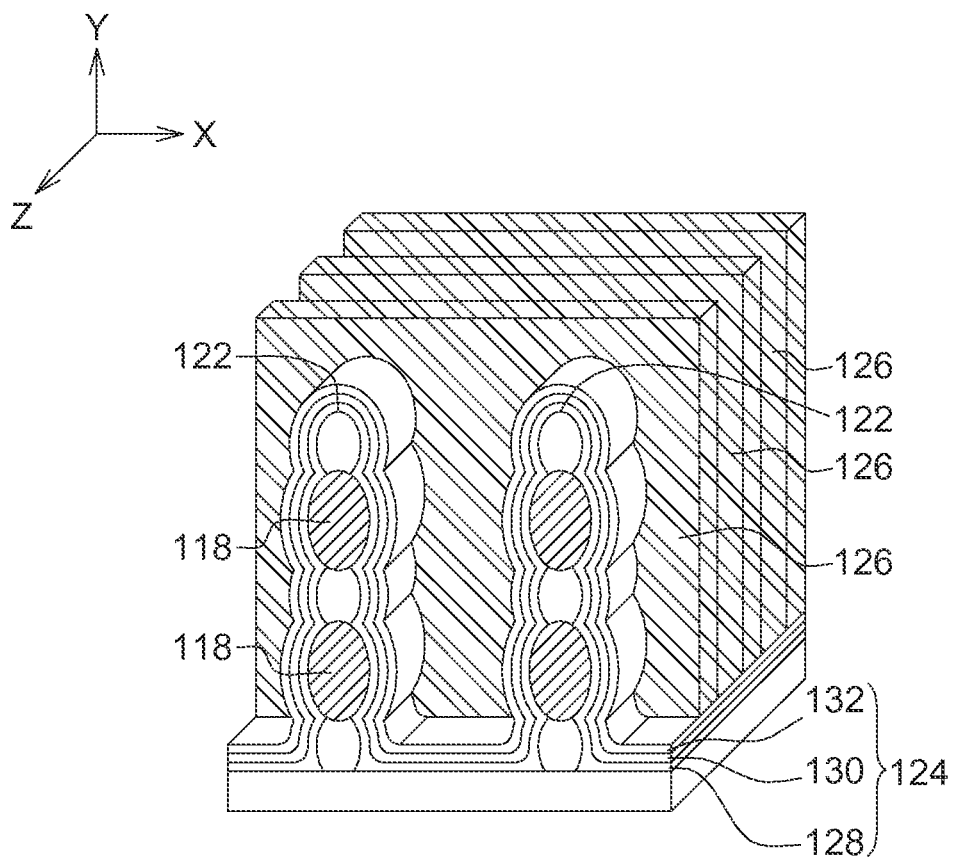
FIG. 5 illustrates a semiconductor device in one embodiment.

FIG. 5 illustrates a semiconductor device in one embodiment. Referring to FIG. 5, in embodiments, a dielectric element 124 is formed on the stacked structures 122 similar with the stacked structure 22 shown in FIG. 4, and conductive lines 126 are formed on the dielectric element 124 for forming a 3D vertical gate memory device, for example, comprising a NAND flash memory and an anti-fuse memory, etc. For example, the silicon-containing conductive structures 118 of different layers in the stacked structure 22 act as bit lines (BL) of memory cells of different planes. The conductive line 126 comprises, for example, polysilicon. The conductive lines 126 may act as word lines (WL), ground selection lines (GSL), or string selection lines (SSL). The dielectric element 124 may have a multi-layers structure, for example, which may be an ONO composite layers, an ONONO composite layers, or a BE-SONOS composite layers (referring to U.S. Pat. Nos. 11/419,977 or 7,414,889), or comprise dielectric layers 128, 130, 132, for example. In one embodiment, the dielectric layer 128 is silicon oxide, the dielectric layer 130 is silicon nitride, and the dielectric layer 132 is silicon oxide. In other embodiments, the dielectric element 124 is a single-layer dielectric material (not shown), comprising a silicon nitride, or a silicon oxide such as silicon dioxide or silicon oxynitride.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a substrate;
   an insulating oxide structure formed on the substrate; and
   a plurality of silicon-containing conductive structures separated from each other by the insulating oxide structure and each of the silicon-containing conductive structures is functioned as a bit line (BL), wherein at least one of the insulating oxide structure and the silicon-containing conductive structure has a bird's beak profile, each of the insulating oxide structures has a contacting end contacting to the insulating structure, and the bird's beak profile forms a decreasing width toward the contacting end in the insulating oxide structure and the silicon-containing conductive structure.

2. The semiconductor structure according to claim 1, wherein the insulating oxide structure and the silicon-containing conductive structure both have the bird's beak profile.

3. The semiconductor structure according to claim 1, wherein the insulating oxide structure and the silicon-containing conductive structures form a stacked structure.

4. The semiconductor structure according to claim 1, further comprising a dielectric element formed on the silicon-containing conductive structure and the insulating oxide structure.

5. The semiconductor structure according to claim 4, wherein the dielectric element comprises a silicon oxide or a silicon nitride.

6. The semiconductor structure according to claim 4, wherein the dielectric element is a single-layer structure or a multi-layer structure.

7. The semiconductor structure according to claim 4, further comprising a conductive line formed on the dielectric element.

8. The semiconductor structure according to claim 7, which is a 3D vertical gate memory device.

9. The semiconductor structure according to claim 7, wherein the conductive line is functioned as a word line (WL), a ground selection line (GSL), or a string selection line (SSL).

10. The semiconductor structure according to claim 7, wherein the conductive line comprises polysilicon.

11. A method of forming a semiconductor structure, comprising:
    providing a substrate;
    forming an insulating oxide structure on the substrate; and
    forming a plurality of silicon-containing conductive structures separated from each other by the insulating oxide structure and each of the silicon-containing conductive structures is functioned as a bit line (BL), wherein at least one of the insulating oxide structure and the silicon-containing conductive structure has a bird's beak profile, each of the insulating oxide structures has a contacting end contacting to the insulating structure, and the bird's beak profile forms a decreasing width toward the contacting end in the insulating oxide structure and the silicon-containing conductive structure.

\* \* \* \* \*